(12) United States Patent
Welsh et al.

(10) Patent No.: US 7,000,623 B2
(45) Date of Patent: Feb. 21, 2006

(54) APPARATUS AND METHOD FOR SUBSTRATE PREPARATION IMPLEMENTING A SURFACE TENSION REDUCING PROCESS

(75) Inventors: Christopher M. Welsh, Livermore, CA (US); Jack T. Matsumoto, Sunnyvale, CA (US)

(73) Assignee: Lam Research Corporation, Fremont, CA (US)

(*) Notice: Subject to any disclaimer, the term of this patent is extended or adjusted under 35 U.S.C. 154(b) by 500 days.

(21) Appl. No.: 10/151,664

(22) Filed: May 17, 2002

(65) Prior Publication Data

US 2003/0000034 A1 Jan. 2, 2003

Related U.S. Application Data

(60) Provisional application No. 60/292,059, filed on May 18, 2001.

(51) Int. Cl.
*B08B 3/00* (2006.01)
(52) U.S. Cl. .................... 134/95.1; 134/99.1; 134/144; 134/153; 134/902
(58) Field of Classification Search .................. 134/61, 134/63, 66, 78–79, 95.1, 99.1, 144, 153, 134/158, 180, 200, 902; 15/77
See application file for complete search history.

(56) References Cited

U.S. PATENT DOCUMENTS 5,271,774 A   12/1993 Leenaars et al.
5,568,821 A * 10/1996 Ohmori et al. ................ 134/61
5,738,574 A *  4/1998 Tolles et al. .................. 451/288
5,837,059 A * 11/1998 Glants .......................... 118/733
5,882,433 A    3/1999 Ueno
5,924,154 A *  7/1999 Gockel et al. .................. 15/77
6,334,902 B1 * 1/2002 Mertens et al. ................ 134/1
6,412,503 B1 * 7/2002 Lerner et al. ............... 134/157
6,491,764 B1 * 12/2002 Mertens et al. ............... 134/36

FOREIGN PATENT DOCUMENTS

| EP | 0444756  | 9/1991 |
| EP | 0898301  | 2/1999 |
| EP | 0905747  | 3/1999 |
| EP | 1091388  | 4/2001 |
| JP | 7-211686 | 8/1995 |
| JP | 11238713 | 8/1999 |

* cited by examiner

*Primary Examiner*—Joseph L. Perrin
(74) *Attorney, Agent, or Firm*—Martine Penilla & Gencarella, LLP

(57) ABSTRACT

Methods and systems for preparing a substrate implementing a surface tension reducing process are provided. In one example, a substrate preparation system includes a chuck which fingers for edge gripping the substrate. The chuck is hollow to provide simultaneous access to both active and backside surfaces of the substrate, and is configured to rotate the substrate. The system includes dispense arms positioned over the substrate surfaces. The dispense arms are capable of moving between a center region and a periphery of the substrate surfaces, and each dispense arm includes a pair of supply lines for delivering fluids over the substrate surfaces. A connection couples the upper dispense arm with the lower dispense arm so that the dispense arms synchronously move between the center region and the periphery of the substrate, and remain aligned on opposite surfaces of the substrate.

19 Claims, 12 Drawing Sheets

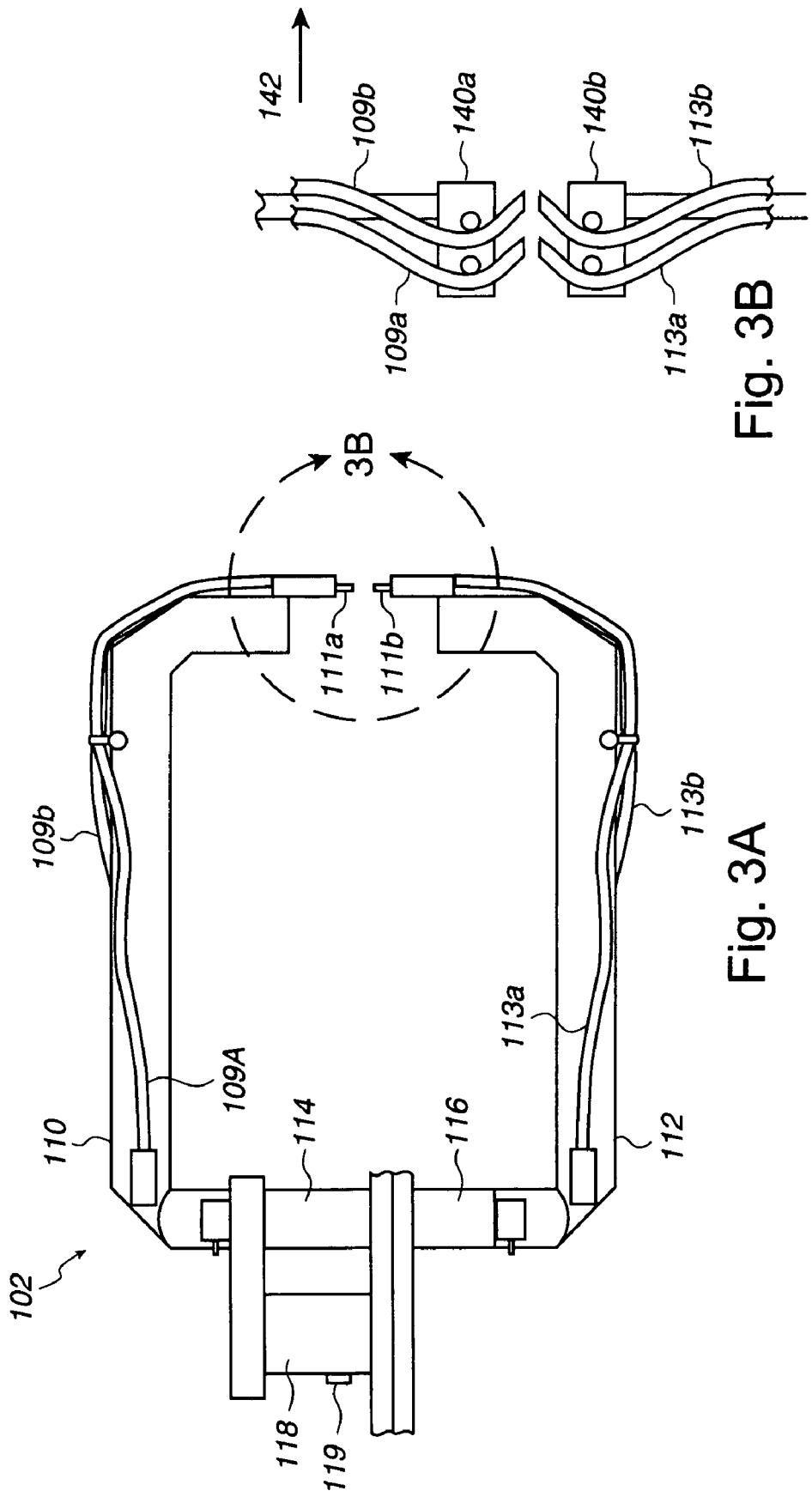

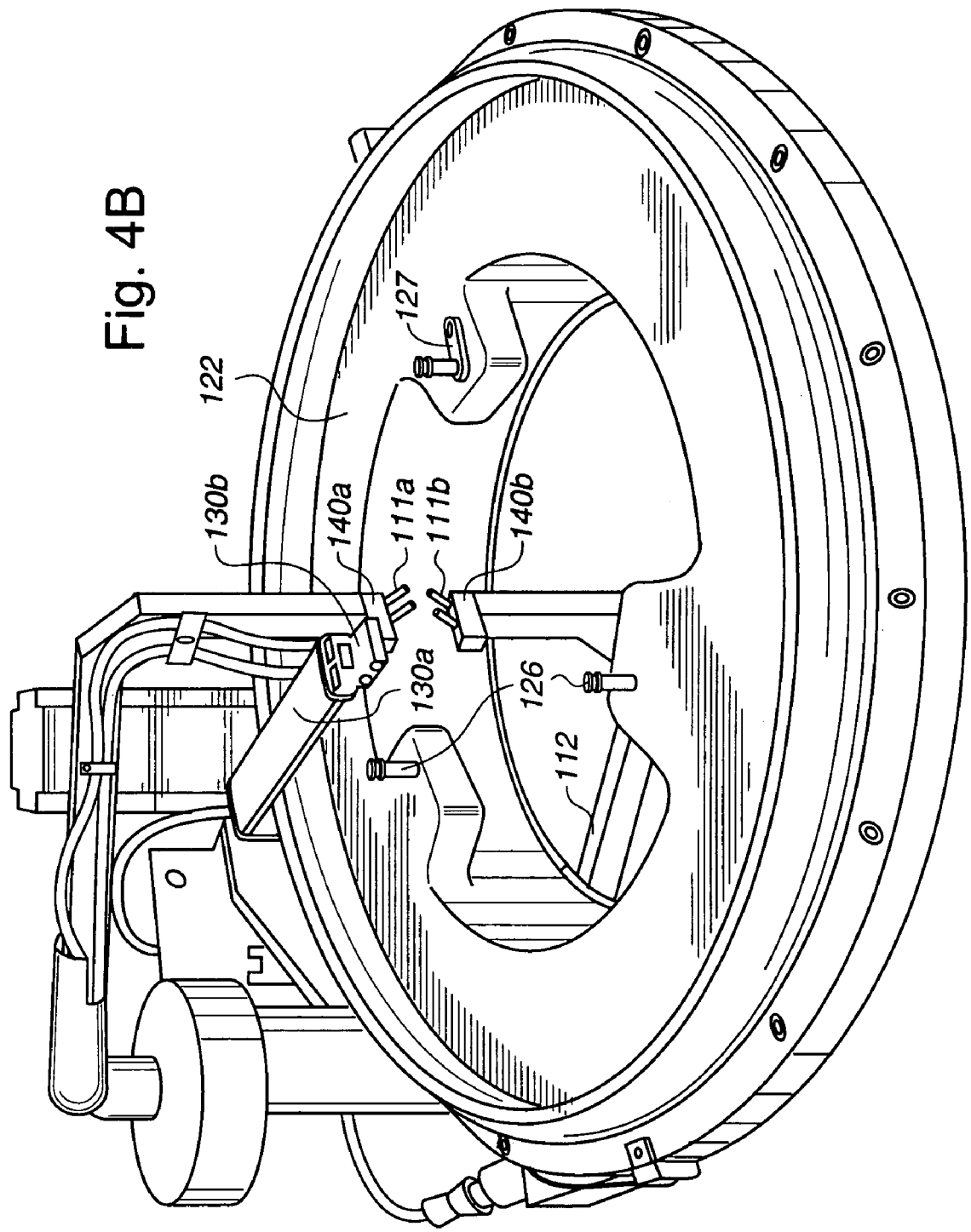

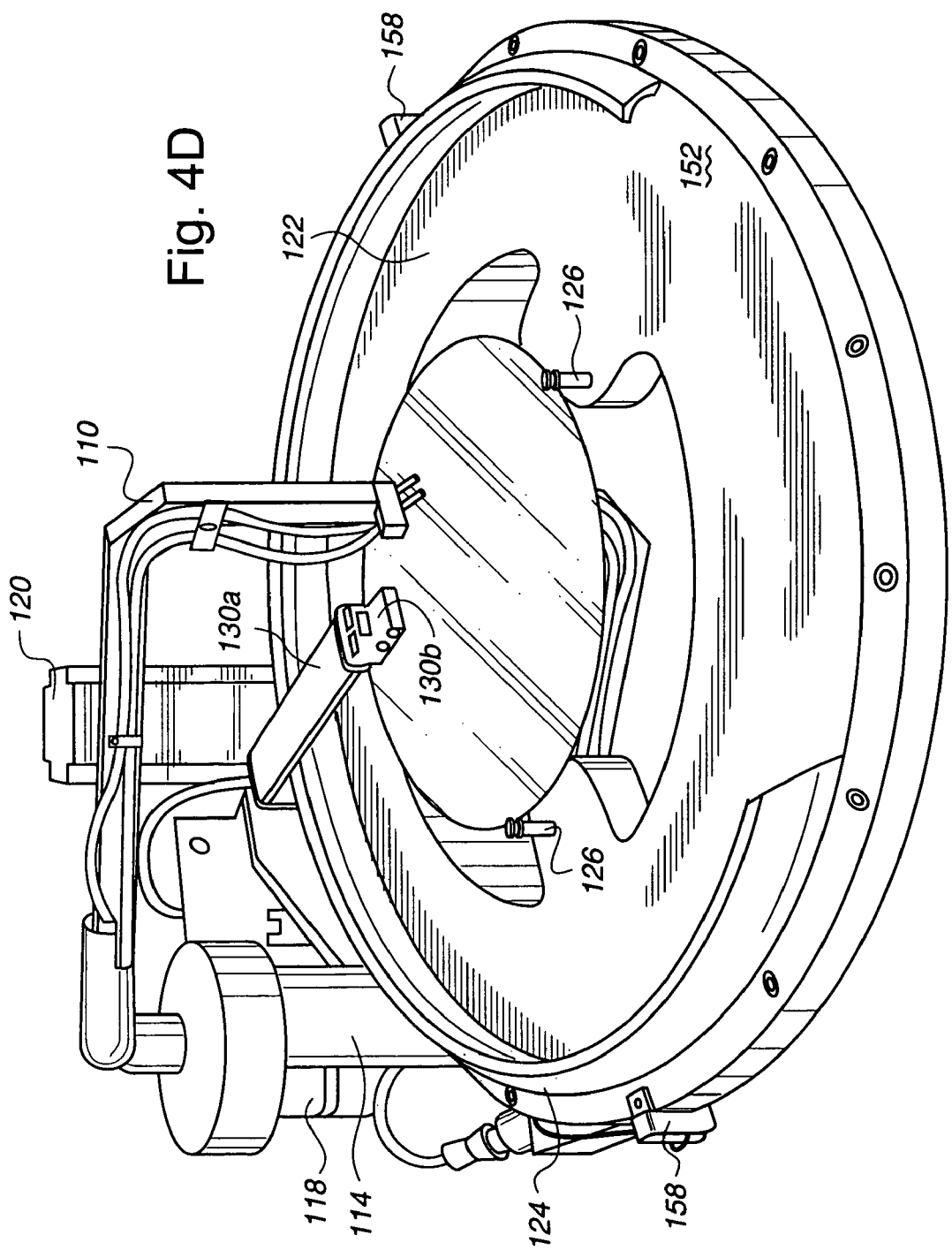

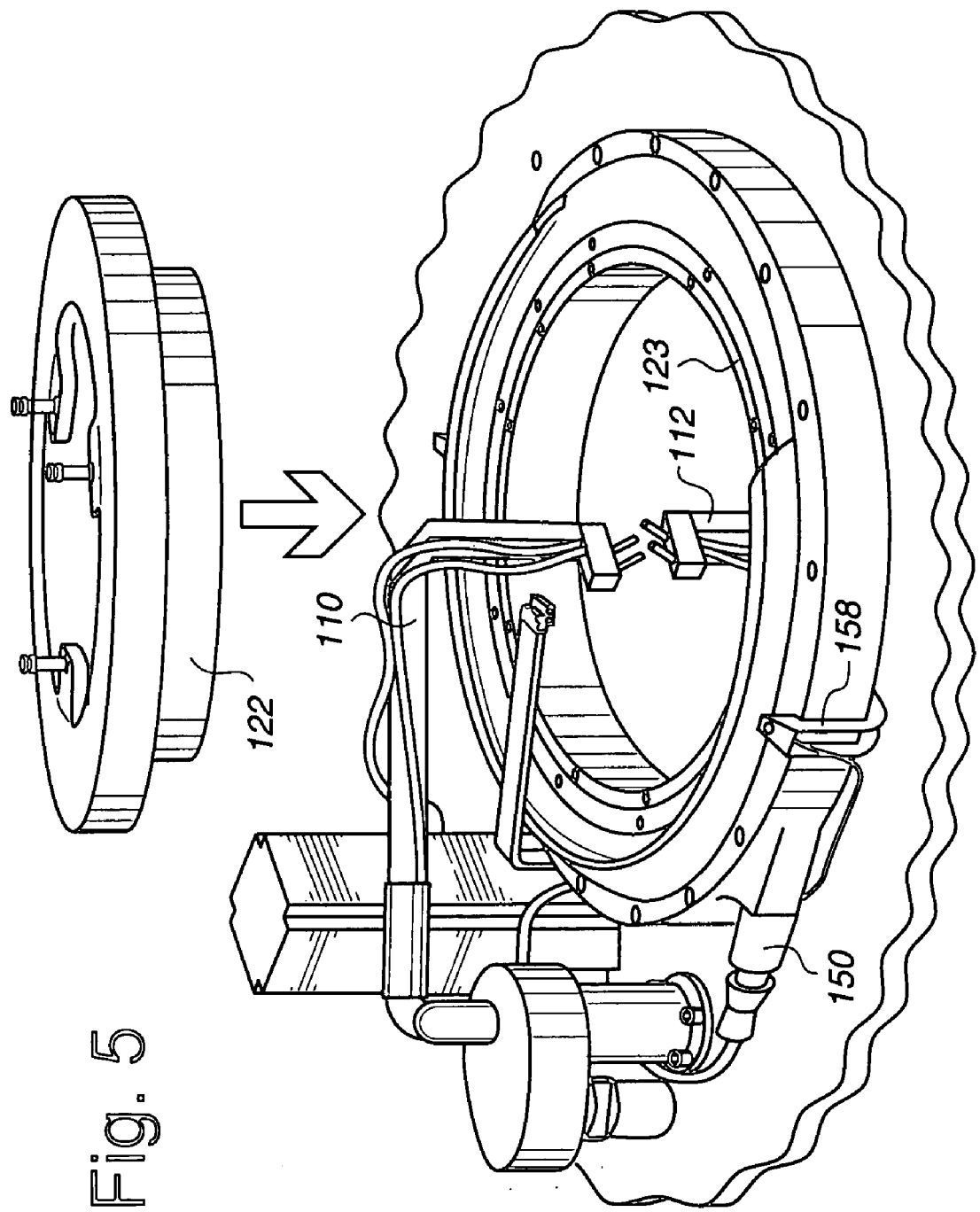

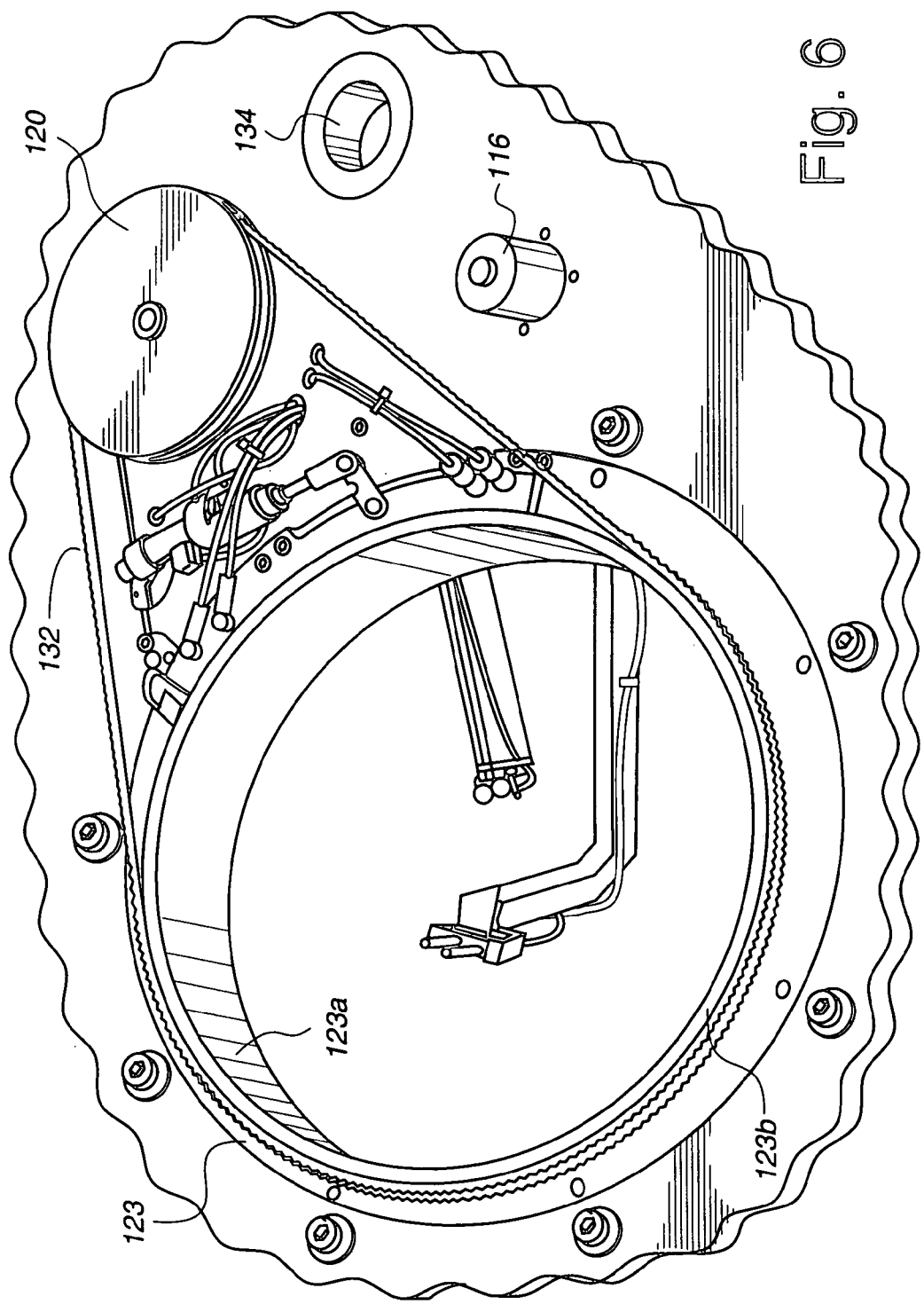

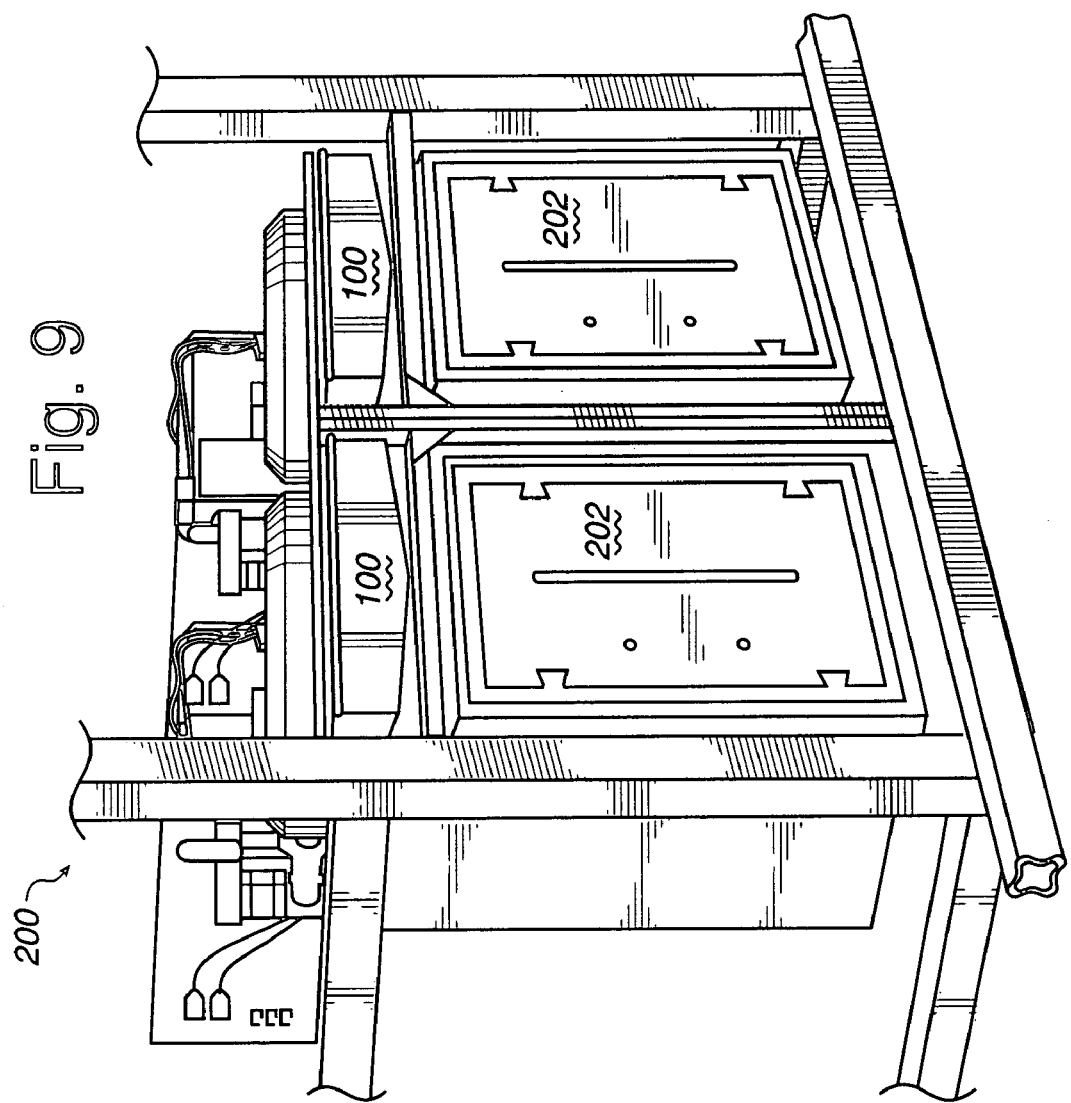

APPARATUS AND METHOD FOR SUBSTRATE PREPARATION IMPLEMENTING A SURFACE TENSION REDUCING PROCESS

CROSS REFERENCE TO RELATED APPLICATIONS

This application claims priority from U.S. Provisional Patent Application No. 60/292,059, filed May 18, 2001, and entitled "APPARATUS AND METHOD FOR ROTAGONI SUBSTRATE PROCESSING." The disclosure of this application is incorporated herein by reference.

BACKGROUND OF THE INVENTION

1. Field of the Invention

The present invention relates generally to substrate and semiconductor wafer preparation systems and methods, and more particularly, the present invention relates to the cleaning and drying of substrates and semiconductor wafers implementing a surface tension reducing process and employing space and process efficient systems.

2. Description of the Related Art

In the fabrication of semiconductor devices, there is a need to perform wet cleaning of substrates at various stages of the fabrication process. Typically, integrated circuit devices are in the form of multi-level structures. At the substrate level, transistor devices having diffusion regions are formed over and into silicon substrates. In subsequent levels, interconnect metallization lines are patterned and electrically connected to the transistor devices to define the desired functional device. As is well known, patterned conductive layers are insulated from other conductive layers by dielectric materials, such as silicon dioxide. At each metallization level there is a need to planarize metal or associated dielectric material. Without planarization, fabrication of additional metallization layers becomes substantially more difficult due to the higher variations in the surface topography. In some applications, metallization line patterns are formed in the dielectric material, and then metal CMP operations are performed to remove excess metallization.

Following each CMP operation, a wet clean of the substrate is performed. The wet clean is designed to wash away any by-products of the fabrication process, remove contaminants, and to achieve and maintain the necessary degree of cleanliness essential to proceed to a subsequent fabrication operation. As transistor device structures become smaller and more complex, the precision required to achieve and maintain structure definition demands exacting standards of cleanliness be maintained in all process operations. If a wet clean is incomplete or ineffective, or if a post-wet clean drying is incomplete or ineffective, then unacceptable residue or contaminants are introduced into the processing environment.

Similarly, in the fabrication of hard disk drives, planarization and cleaning operations are needed to maintain a clean and smooth disk substrate. Residue or contaminants remaining on substrates in the fabrication of hard disks and other devices utilizing similar substrates is likewise unacceptable.

Rinsing and drying techniques, methods, and apparatus are plentiful and known in the art, and incorporate such operations as rinsing and scrubbing, immersion, and the application of thermal, mechanical, chemical, electrical, or sonic energy and the like to remove or displace water and dry the substrate. While some scrub and rinse operations may employ acids or bases for vigorous interaction with fabrication by-products, deionized water (DIW) is commonly used to perform a final rinse before the desired drying technique is performed.

One common drying technique is known as spin, rinse and dry (SRD). SRD uses mechanical, centrifugal, energy to rid the substrate of water by spinning the substrate until dry. An SRD apparatus typically includes a substrate mounting plate within a bowl and mounted on a shaft that is configured to rotate and thus spin the substrate. The substrate is typically attached to the substrate mounting plate or spin chuck with mounting pins configured to maintain the substrate in a horizontal orientation. Rapid rotation of the spin chuck therefore spins the substrate and forces the water from the surface of the substrate. DIW is typically dispensed from a nozzle which is positioned over the substrate and connected to a DIW supply.

The SRD process essentially includes applying DIW and spinning the substrate dry. The drying can be enhanced with the introduction of an inert gas such as Nitrogen or an inert gas vapor to displace any water that is not completely removed by spinning. Additional variations include heating the DIW, heating the SRD environment, heating the inert gas, and the like.

Another common drying technique is known as a Marangoni technique. Marangoni drying typically includes using a chemical drying fluid or solvent such as isopropyl alcohol (IPA) to introduce favorable surface tension gradients facilitating removal of water from the surface of a substrate. Variations of the Marangoni technique also include the introduction of an inert gas such as Nitrogen as a carrier gas for IPA vapor delivery.

Prior art drying also includes the combination of the Marangoni technique with an SRD apparatus. This method has included the introduction of IPA or IPA vapor to a surface of a substrate which is mounted on a spin chuck. As the spin chuck rotates the substrate, centrifugal force drives water from the surface of the substrate, and Marangoni drying maximizes removal of water from the surface of the substrate while minimizing residue or contaminants.

A limitation of the combination of SRD and Marangoni techniques is that the typical prior art SRD provides for single-sided rinsing and drying of a wafer or substrate. A substrate mounted on a spin chuck has only one surface exposed for rinsing and drying. In order to achieve and maintain the level of cleanliness desired for current fabrication environments, simultaneous dual-sided rinsing and drying is needed.

In view of the foregoing, there is a need for substrate preparation systems and methods that maximize the cleaning and drying of wafers and other substrates in order to meet and exceed the ever more stringent cleanliness requirements for fabrication processes.

SUMMARY OF THE INVENTION

Broadly speaking, the present invention fills these needs by providing a substrate preparation system that implements a surface tension reducing process to effectively and efficiently provide cleaning, drying, etching, or other desired processing of a substrate, and that performs the processing on both top or active and backside surfaces of a substrate simultaneously. The present invention can be implemented in numerous ways, including as a process, an apparatus, a system, a device, or a method. Several embodiments of the present invention are described below.

In one embodiment, a system for rinsing and drying a substrate is disclosed. The system includes a chuck having fingers for edge gripping the substrate. The chuck is configured to rotate the substrate. The system further includes an upper dispense arm positioned over an active surface of the substrate, and a lower dispense arm positioned below a backside surface of the substrate. The upper dispense arm is capable of moving between a center region and a periphery of the active surface of the substrate, and the lower dispense arm is capable of moving between a center region and a periphery of the backside surface of the substrate. Each dispense arm further includes a pair of supply lines for delivering fluids over each of the active surface and the backside surface of the substrate. The system also includes a connection coupling the upper dispense arm with the lower dispense arm so that as the upper dispense arm and the lower dispense arm move between the center region and the periphery of the substrate, the upper dispense arm and the lower dispense arm remain aligned on opposite surfaces of the substrate.

In another embodiment, a system for rinsing and drying a substrate is disclosed. The system includes a chuck configured to rotate the substrate and having fingers for edge gripping the substrate. The system further includes a first dispense arm positioned adjacent to an active surface of the substrate, and a second dispense arm positioned adjacent to a backside surface of the substrate. The first dispense arm is capable of moving between a center region and a peripheral edge of the active surface of the substrate, and includes a pair of supply lines for delivering fluids over the active surface of the substrate The second dispense arm is capable of moving between a center region and a peripheral edge of the backside surface of the substrate, and includes a pair of supply lines for delivering fluids over the backside surface of the substrate. The system also includes a spray shield surrounding the substrate in the chuck. The spray shield is configured with a sliding door. When the sliding door is in an open position access is provided to insert and remove the substrate from the fingers of the chuck.

In still a further embodiment, a system for preparing a substrate is disclosed. The system includes a chuck which has fingers for edge gripping the substrate, and which is configured to rotate the substrate. In the system, a first dispense arm is positioned beside an active surface of the substrate. The first dispense arm is capable of moving between a center region and a peripheral edge of the active surface of the substrate. The first dispense arm further includes a first pair of supply lines for delivering fluids over the active surface of the substrate. The first pair of supply lines are angled in a direction toward the peripheral edge. The system further includes a second dispense arm positioned beside a backside surface of the substrate. The second dispense arm is capable of moving between a center region and a peripheral edge of the backside surface of the substrate. The second dispense arm further includes a second pair of supply lines for delivering fluids over the backside surface of the substrate. The second pair of supply lines are angled in a direction toward the peripheral edge.

The advantages of the present invention are numerous. One notable benefit and advantage of the invention is the simultaneous preparation of both top or active and backside surfaces of a substrate. The hollow design of the spindle and chuck provides access to both the active and the backside surfaces of a substrate for cleaning, drying, or otherwise processing.

Another benefit is the ease with which the present invention is configured for a plurality of substrate sizes. The procedure to swap out one size of substrate chuck for another is fast and efficient providing for multiple applications and minimum down time for integrated process systems. Additionally, the design provides for ease of belt changing or tensioning by adjustment of the spindle motor position.

An additional benefit is the ability to integrate the system into existing process equipment resulting in increased quality and quantity of product with fewer defects or scrap due to contamination. The low profile of the spray shield and spray shield door is desirable for many systems, and the pneumatic door is simply formed and does not generate particles within the system.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIG. 3A shows a detailed view of the dispense arm assembly in accordance with one embodiment of the invention.

FIG. 3B shows a detail of upper dispense nozzles and lower dispense nozzles in accordance with one embodiment of the invention.

FIG. 4B illustrates the chuck and spray shield of a substrate drying system in accordance with one embodiment of the invention.

FIG. 4D shows a chuck with a wafer positioned thereon in accordance with an embodiment of the invention.

FIG. 5 shows removal of chuck in accordance with one embodiment of the present invention.

FIG. 6 shows a bottom or under-side of a substrate drying system in accordance with one embodiment of the invention.

FIG. 9 shows a substrate processing station in accordance with one embodiment of the invention.

DETAILED DESCRIPTION OF THE PREFERRED EMBODIMENTS

An invention for substrate preparation is disclosed. In preferred embodiments, apparatus and methods include a substrate rinsing and drying apparatus implementing a surface tension reducing process and providing for the rinsing and drying of wafers or other substrates on both top or active and bottom or backside surfaces simultaneously with a precisely controlled process. The substrate rinsing and drying apparatus, in one embodiment, is implemented in a substrate cleaning and drying system that can include one or more brush box scrubbing apparatus and one or more substrate dryers in accordance with embodiments of the present invention for rinsing and drying substrates following brush box processing.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
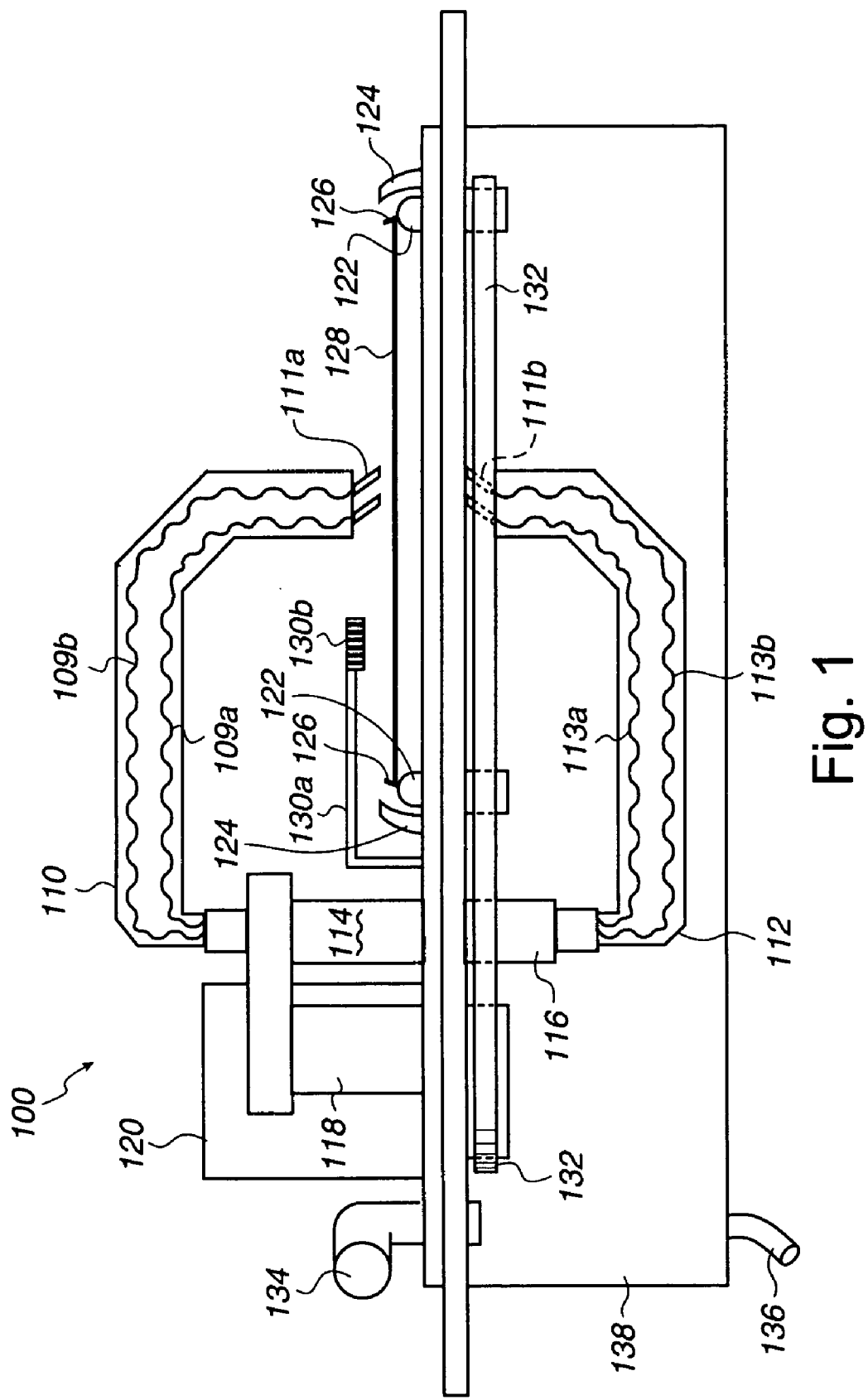
FIG. 1 shows a substrate drying system in accordance with one embodiment of the present invention.

FIG. 1 shows a substrate drying system 100 in accordance with one embodiment of the present invention. The substrate drying system 100 includes a hollow spindle 123 to which is attached a hollow chuck 122 configured to hold a substrate 128 and which is disposed within and over a drip tray 138. Upper dispense arm 110 is positioned over a top surface of the substrate 128, and lower dispense arm 112 is positioned symmetrically opposed to upper dispense arm 110 and beneath a bottom or backside surface of substrate 128. Upper dispense arm 110 is supported by upper dispense arm support post 114 which is mechanically connected (not shown) to a dispense arm drive shaft (not shown) disposed within a dispense arm drive shaft housing 118. Lower dispense arm 112 is supported by lower dispense arm support post 116 which is magnetically connected (not shown) to upper dispense arm support post 114.

Substrate 128 is affixed to hollow chuck 122 with fingers 126. Hollow chuck 122 is configured to rotate with the rotation of hollow spindle 123 to which hollow chuck 122 is attached. Spindle motor 120 is configured to provide rotational energy which is applied to hollow spindle 123 with drive belt 132, which spins hollow spindle 123, chuck 122 and substrate 128 which is locked to hollow chuck 122 in fingers 126.

Surrounding hollow chuck 122, fingers 126, and substrate 128 is spray shield 124. Spray shield 124 is configured to contain any liquid from the rinsing and drying process to the region around hollow chuck 122. In one embodiment of the invention, spray shield 124 is configured with a sliding door (see FIGS. 4A, 4B and 4D) that is magnetically coupled to a semi-circular pneumatic system to provide lateral access to the hollow chuck 122 for the insertion and removal of substrates 128. The configuration and operation of spray shield 124 and door is described in greater detail below in reference to FIG. 4A.

In one embodiment, wafer sensor arm 130a is positioned between upper dispense arm support post 114 and spray shield 124 and configured to position wafer sensor 130b over the surface of a substrate 128. Wafer sensor 130b is configured to sense the presence of substrate 128, and determine the correct positioning and orientation of the substrate 128 disposed in fingers 126. In one embodiment, substrate 128 must be precisely positioned in order to lock moveable finger 127 (see FIGS. 4A, 4B, and 4C) and proceed with substrate preparation in the substrate drying system 100. Wafer sensor 130b senses and assures a level orientation and accurate positioning of a substrate 128 allowing the moveable finger 127 to lock the substrate in place, and proceed with rinsing, drying, or other substrate preparation.

In one embodiment of the invention, a drying agent is applied to the active surface and to the backside surface of substrate 128. Examples of drying agents include IPA, IPA vapor, Nitrogen ($N_2$) gas, and other inert gasses or vaporized chemicals. Some drying agents produce by-products or result in excess vapors that can become trapped within drip tray 138. An exhaust 134 is provided for the release of airborne chemicals or vapors, and a drain 136 is provided to drain any liquid residue of both cleaning and drying agents.

Upper dispense arm 110 and lower dispense arm 112 provide for the supply of cleaning, drying, rinsing, or other agents or fluids as desired through upper dispense nozzles 111a and lower dispense nozzles 111b to the active surface and to the backside surface, respectively, of a substrate 128 positioned in fingers 126 on the hollow chuck 122. In one embodiment, the upper dispense arm 110 and the lower dispense arm 112 are mirror images of each other, positioned in substantially the same locations on opposite sides of a substrate 128.

Figure 2:
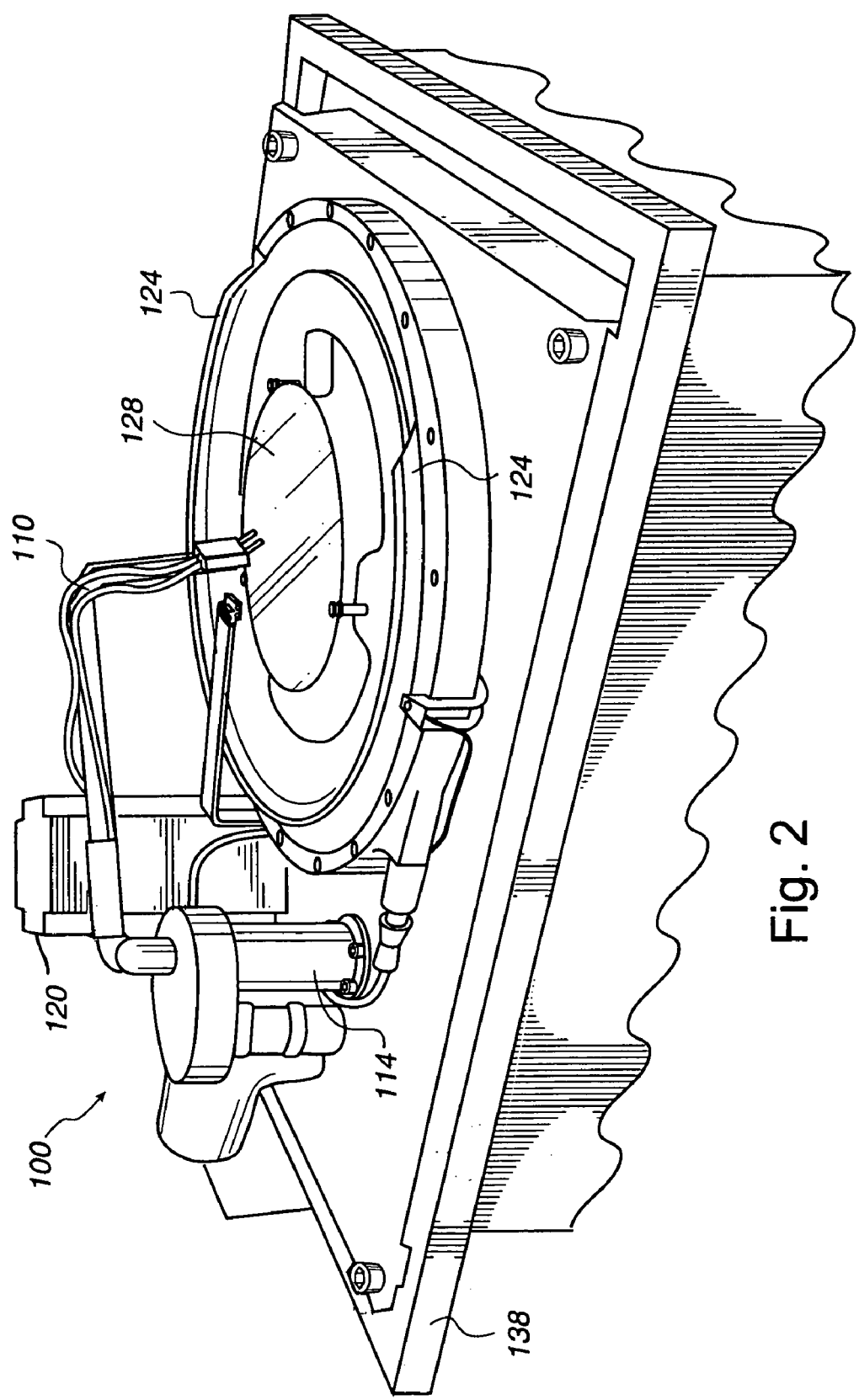
FIG. 2 illustrates a substrate drying system in accordance with one embodiment of the present invention.

FIG. 2 illustrates a substrate drying system 100 in accordance with one embodiment of the present invention. The perspective shown in FIG. 2 shows a wafer 128 positioned in a chuck 122 of the substrate drying system 100. An opening in the spray shield (described in greater detail below in reference to FIG. 4A) allows access to insert or remove a wafer 128 from chuck 122. Upper dispense arm 110 supported by upper dispense arm support post 114 is positioned over wafer 128. Drip tray 138 having exhaust 134 encloses the lower features of the substrate drying system 100 illustrated in FIG. 2.

FIG. 3A shows a detailed view of the dispense arm assembly 102 in accordance with one embodiment of the invention. In the illustrated embodiment, drying agent supply 109a and cleaning agent supply 109b are routed along upper dispense arm 110 to upper dispense nozzles 111a where a cleaning agent and a drying agent are applied to an active surface of a substrate (not shown in FIG. 2A). Drying agent supply 113a and cleaning agent supply 113b are routed along lower dispense arm 112 to lower dispense nozzles 111b where a cleaning agent and a drying agent are applied to a backside surface of a substrate (not shown in FIG. 2A). In other embodiments, any desired agent, vapor, or other fluid is routed through supply 109a, 109b, 113a, and 113b, and dispensed through dispense nozzles 111a, 111b.

In one embodiment, positioning of the upper dispense arm 110 and the lower dispense arm 112 across the active surface and across the backside surface of a substrate is controlled by a dispense arm controller (not shown) and a dispense arm drive shaft (not shown) contained within a dispense arm drive shaft housing 118. Electrical connector 119 located on the exterior of the dispense arm drive shaft housing 118 provides for electrical power connection to the dispense arm controller disposed within.

In one embodiment, the dispense arm drive shaft is mechanically connected to the upper dispense arm support post 114 providing a direct mechanical connection between the drive shaft and the upper dispense arm 110 to position the upper dispense arm 110. The upper dispense arm 110 is configured to pivot about the upper dispense arm support post 114 to move the upper dispense arm 110 and position the upper dispense nozzles 111a across an active (top) surface of a substrate. In one embodiment of the invention, the rinsing and drying process dispenses the cleaning agent and the drying agent along a radius of a spinning substrate from a center region of the substrate to a peripheral region of the substrate. The upper dispense arm 110 is therefore moved along the surface of the spinning substrate from the center region outward to a peripheral region.

The lower dispense arm 112 is configured to substantially mirror the movement of the upper dispense arm 110. Therefore, as the upper dispense arm 110 moves along the surface of the spinning substrate from the center region outward to a peripheral region, the lower dispense arm 112 is positioned substantially opposing the upper dispense arm 110 on the opposite or backside surface of the substrate, moving from the center region to the outer region of the substrate with the upper dispense aim 110. In one embodiment, the lower dispense arm 112 is not mechanically connected, however, to the dispense arm drive shaft.

In one embodiment of the invention, the lower dispense arm 112 is magnetically connected to the upper dispense arm 110 through upper dispense arm support post 114 and the lower dispense arm support post 116. The magnetic connection provides for positive mechanical control of the upper dispense arm 110 which is mirrored by the lower dispense arm 112. In one embodiment, the magnetic coupling is with a magnet which provides control of the degree of movement of the lower dispense arm 112. By way of example, the lower dispense arm 112 can be halted near a periphery of a substrate as it approaches an interior wall of the hollow spindle 123. Upper dispense arm 110 can continue travel to the periphery of the substrate while lower dispense arm 112 remains stationary near a periphery region of the backside of the substrate 128. As can be appreciated from FIG. 1 and FIGS. 4A and 6 described below, movement of the upper dispense arm 110 can continue to fingers 126 while lower dispense arm 112 is limited to movement within the confines of the hollow spindle 123.

FIG. 3B shows a detail of upper dispense nozzles 111a and lower dispense nozzles 111b in accordance with one embodiment of the invention. In the illustrated embodiment, upper dispense nozzles 111a include a nozzle from the drying agent supply 109a and a nozzle from the cleaning agent supply 109b attached to an upper dispense arm head 140a and directed generally downward. Similarly, lower dispense nozzles 111b include a nozzle from the drying agent supply 113a and a nozzle from the cleaning agent supply 113b attached to a lower dispense arm head 140b and directed generally upward.

In one embodiment of the invention, a substrate is mounted on a hollow chuck 122 attached to a hollow spindle 123 which is rotated. Upper dispense nozzles 111a are directed at a top or active surface of the substrate 128, and lower dispense nozzles are directed at a bottom or backside surface of the substrate 128. In one embodiment, upper dispense nozzles 111a and lower dispense nozzles 111b are each angled in a direction toward the periphery region of substrate 128. As the upper dispense arm 110 and lower dispense arm 112 are moved from a center of the substrate 128 attached to and rotating with the chuck 122, to a periphery region of the substrate 128 in direction 142, a cleaning agent is applied through the nozzle from the cleaning agent supply 109b on upper dispense arm head 140a, and through the nozzle from the cleaning agent supply 113b on lower dispense arm head 140b to the active and to the backside surfaces of the substrate 128. As will be described in greater detail below, in one embodiment, the cleaning agent is followed immediately by the drying agent which is applied through the nozzle from drying agent supply 109a on upper dispense arm head 140a, and through the nozzle from drying agent supply 113a on lower dispense arm head 140b. Therefore, as the upper dispense arm 110 and the lower dispense arm 112 are moved across the surface of a substrate in direction 142, a cleaning agent and a drying agent are applied to both top and bottom surfaces of a rotating substrate attached to the chuck 122.

Figure 4A:
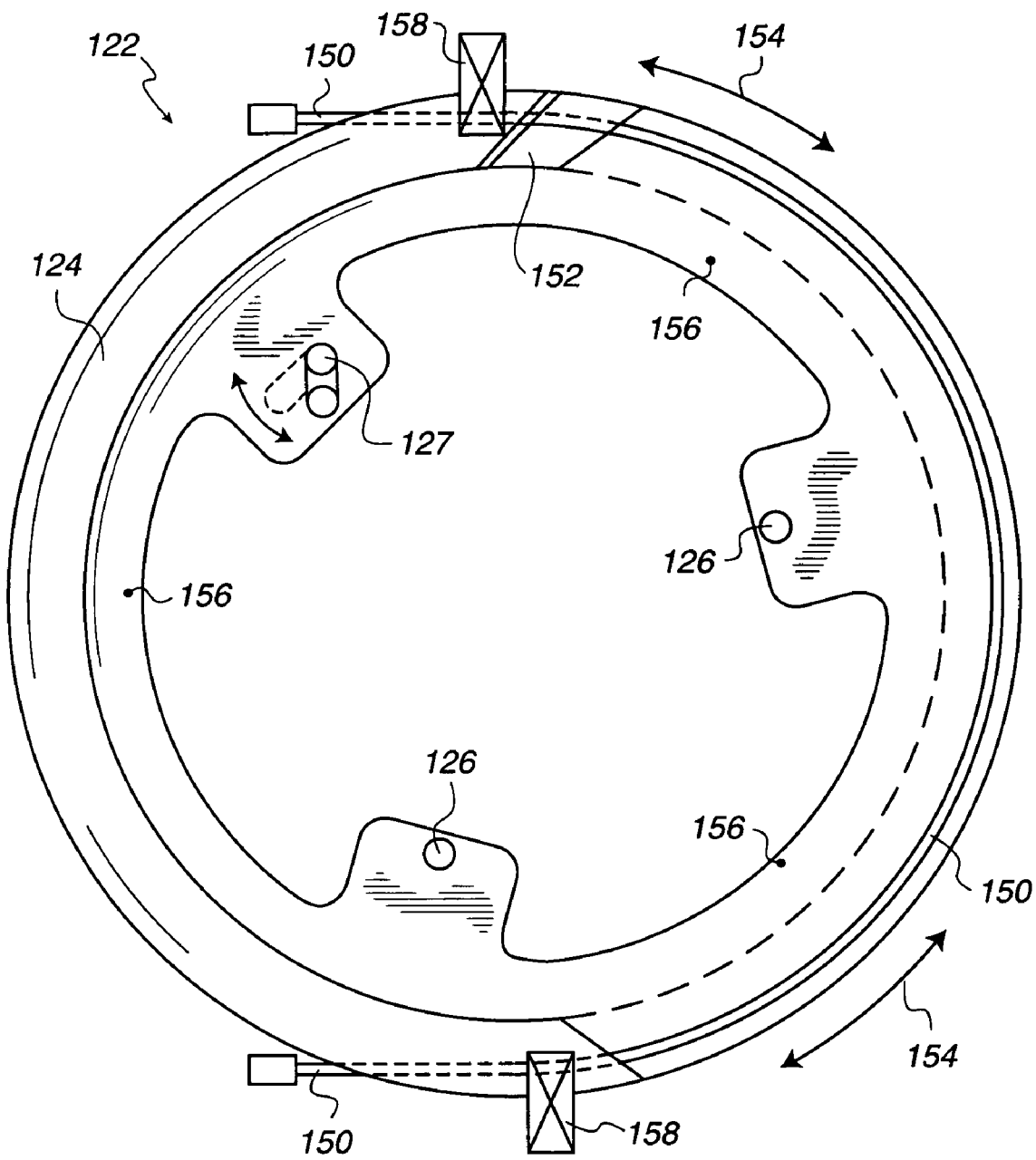
FIG. 4A shows a hollow chuck in accordance with one embodiment of the invention.

FIG. 4A shows a hollow chuck 122 in accordance with one embodiment of the invention. The hollow chuck 122 is configured to be coupled to the substrate drying system 100 (see FIG. 1) to provide for support, rotation, and access to a top or active surface and to a backside of a substrate. In FIG. 4A, the hollow chuck 122 is shown from overhead. In one embodiment, the circular hollow chuck 122 is configured to be coupled to the hollow spindle 123. The hollow spindle 123 is driven to rotate as described below, and the circular chuck 122 feely rotates to spin a substrate 128 attached to the hollow chuck 122. The cylindrical hollow spindle 123 is configured to provide for attachment of a drive belt 132 (e.g., see FIG. 1) to provide the rotational force. In one embodiment, the hollow spindle 123 includes a stationary part providing for attachment to the substrate drying system 100, and a rotating part providing for attachment to the chuck 122. Access is provided to both an active surface and a backside surface of a substrate 128, allowing for the upper dispense arm 110 and the lower dispense arm 112 to simultaneously supply cleaning, drying, or other agents to both surfaces of a spinning substrate 128.

In one embodiment, spray shield 124 encircles the chuck 122. Spray shield 124 is configured to confine any liquid used in the cleaning, drying, or other process to a space within the cavity containing the hollow spindle 123 and attached chuck 122. As cleaning, drying, or other agents are applied to a substrate during processing, any droplets that may be thrown from the spinning substrate are blocked by the spray shield 124 and confined within the interior cavity having the hollow spindle 123 and attached chuck 122. Spray shield 124 can be constructed of PET, plastic, polyurethane, or any suitable light weight material to provide strength and form, is easily cleaned, and suitable for clean room applications.

In one embodiment of the invention, a sliding spray shield door 152 is configured to provide access to the interior region or cavity having the hollow spindle 123 and attached chuck 122. In one embodiment, sliding spray shield door 152 is configured as a section of spray shield 124 that slides open to provide access to the interior region or cavity, and slides closed to create a substantially solid spray shield 124 encircling the hollow spindle 123 and chuck 122. When the spray shield door 152 is in the open position, a substrate 128 can be inserted onto or removed from chuck 122. The access provided by opening the sliding spray shield door 152 allows a substrate 128 to be inserted by a robot (not shown) at a proper position and orientation to be received in fingers 126. Once the substrate is inserted and attached to fingers 126, the sliding spray shield door 152 can be closed to maintain circular containment of any fluids within the cavity of the hollow spindle 123 and chuck 122. In one embodiment, substrate 128 is inserted into fingers 126, and wafer sensor 130b senses and assures proper orientation and positioning. Once proper orientation and positioning is assured, moveable finger 127 (see FIG. 4A) locks substrate 128 in position. The robot (not shown) is withdrawn, and sliding spray shield door 152 closes, allowing spindle 123 to rotate, thus rotating chuck 122 and mounted substrate 128.

In one embodiment of the invention, actuation to position the sliding spray shield door 152 in an open or closed position is provided by a pneumatic actuator (not shown). Pneumatic tube 150 is routed along a periphery of a section of spray shield 124 at a base or lower region of spray shield 124. In one embodiment, pneumatic tube 150 is configured with a magnetic ball or bearing within the tube. The pneumatic actuator moves the magnetic ball along the interior of pneumatic tube 150. When air pressure is supplied to a first end of pneumatic tube 150, exhaust (venting) or vacuum is provided at a second end of pneumatic tube 150, enabling travel of the magnetic ball within pneumatic tube 150 along a path of pressure to exhaust (venting) or vacuum. In one embodiment, the pneumatic actuator is configurable to supply pressure to both the first end and the second end, and to provide for exhaust or vacuum to both the first end and the second end of pneumatic tube 150. In this manner, the magnetic ball is configured for travel within the length of pneumatic tube in either direction as shown by directional arrow 154. Sliding spray shield door 152 is configured with a magnetic latch (not shown) to magnetically attach to the magnetic ball. As the magnetic ball travels along and within pneumatic tube 150, the magnetic latch attaches sliding spray shield door 152 to the magnetic ball and opens or closes the sliding spray shield door 152, sliding it to an open position or a closed position coupled to the position of the magnetic ball within pneumatic tube 150. In one embodiment, door position sensors 158 are provided to indicate the state of sliding spray shield door 152.

FIG. 4B illustrates the chuck 122 and spray shield 124 of a substrate drying system 100 in accordance with one embodiment of the invention. In the perspective illustrated in FIG. 4B, the sliding spray shield door 152 is in a closed position, completely encircling the interior cavity of the chuck 122 and spindle (not visible in FIG. 4B), and maintaining the integrity of the spray shield 124 around the processing region.

When sliding spray shield door 152 is in the open position, access is provided to insert or remove a substrate 128. Fingers 126 are configured to receive and support a substrate 128 over hollow spindle 123 and chuck 122. In one embodiment, moveable finger 127 is provided to secure a substrate 128 in place. When a substrate 128 is inserted, at least two fingers 126 are configured to receive the substrate 128. As a substrate 128 is positioned in fingers 126 by a robot (not shown), moveable finger 127 is in an open or unlock position. When the substrate 128 is properly positioned in fingers 126, moveable finger 127 pivots into an edge of the substrate 128 to lock the substrate 128 in place. A properly positioned substrate 128, therefore, is supported at the edges by fingers 126 and moveable finger 127. In one embodiment, fingers 126 and moveable finger 127 are configured to position a substrate 128 slightly off-center from an axis of rotation of hollow spindle 123 and chuck 122. The slightly off-center positioning is configured to further secure a substrate 128 against fingers 126, and minimize pressure against moveable finger 127 generated during rotation of hollow spindle 123.

Figure 4C:
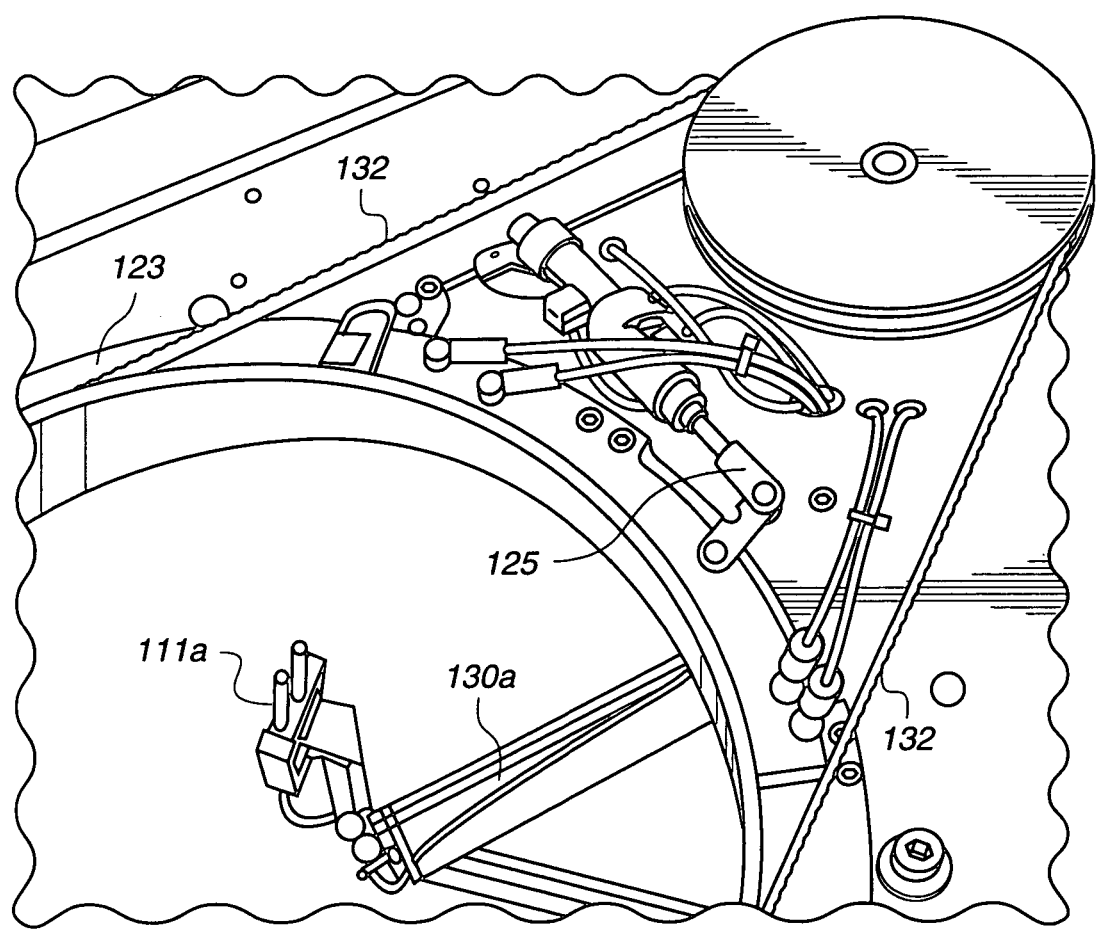
FIG. 4C illustrates a moveable finger actuator in accordance with one embodiment of the invention.

In one embodiment, an actuator 125 (see FIG. 4C) for moveable finger 127 is located adjacent to the hollow spindle 123, and attached to the stationary part of the hollow spindle 123. FIG. 4C illustrates a moveable finger actuator 125 in accordance with one embodiment of the invention. The moveable finger actuator 125 is configured to prevent movement or rotation of the rotating part of hollow spindle 123 when the moveable finger 127 is in an open or unlocked position. Once a substrate has been positioned and the moveable finger 127 has locked the substrate in place, the moveable finger actuator is configured to allow movement and rotation of the rotating part of the hollow spindle 123. In one embodiment, rotation of the hollow spindle 123 is further prevented until door position sensor 158 indicates sliding spray shield door 152 is in a closed position, and therefore any robot used to insert or remove a substrate is withdrawn from the hollow spindle 123 and chuck 122.

FIG. 4D shows a chuck 122 with a wafer 128 positioned thereon in accordance with an embodiment of the invention. In the embodiment illustrated in FIG. 4D, a wafer 128 has been positioned in fingers 126 and locked into position by moveable finger 127. Wafer 128 is therefore held in place by the edges at fingers 126 and moveable finger 127. In accordance with one embodiment of the invention, once moveable finger 127 locks wafer 128 in place and wafer sensor 130*b* indicates the presence and proper orientation of wafer 128, sliding spray shield door 152 is permitted to close and provide a continuous spray shield 124 around the spindle (not visible), chuck 122, and wafer 128. In one embodiment, door position sensor 158 senses position of sliding spray shield door 152 as one of closed or not closed.

FIG. 5 shows removal of chuck 122 in accordance with one embodiment of the present invention. In one embodiment of the invention, chuck 122 is exchangeable to accommodate a plurality of substrate sizes. As described above, hollow spindle 123 includes a rotating part and a stationary part. Chuck 122 having pins 126 and moveable pin 127 is configured to attach to the rotating part of hollow spindle so that rotation of the hollow spindle 123 spins the chuck 122 and substrate 128 disposed thereon. In one embodiment of the present invention, chuck 122 is fabricated of a substantially solid piece of PET, plastic, polyurethane, or other suitable material, and includes pins 126 and moveable pin 127 for receiving a substrate, as well as attachment points 156 (see FIG. 4A) for attaching the chuck 122 to a ring or bearing within the hollow spindle 123 that is configured to rotate. In one embodiment, chuck 122 is configured for specific substrate sizes so that configuration of the substrate drying system 100 for a specific substrate size requires only attachment of the corresponding chuck 122 for the desired substrate size. By way of example, common semiconductor wafer sizes include 200 mm and 300 mm wafers. One embodiment of the present invention includes a 200 mm configuration and a 300 mm configuration, and re-configuration for the desired wafer size requires only removal of one chuck 122 by disconnecting the chuck 122 from the hollow spindle 123 at attachment points 156, and replacement with a chuck 122 for the desired substrate size.

FIG. 6 shows a bottom or under-side of a substrate drying system 100 in accordance with one embodiment of the invention. In the illustrated embodiment, the substrate drying system 100 has been flipped over, and the drip tray 138 has been removed. Additionally, a drive belt cover which is typically configured to the substrate drying system 100 has been removed, and the drive belt 132 is shown configured around the hollow spindle 123, and around a pulley attached to the bottom of the spindle motor 120. As can be seen in FIG. 6, in one embodiment of the invention, the drive belt 132 wraps around the rotating part 123*a* of the spindle 123 and is driven by the spindle motor 120 to provide the rotational force to spin the spindle 123 and attached chuck (not visible in FIG. 6). Stationary part 123*b* of the spindle 123 is also shown attached to the substrate drying system 100 and with moveable finger actuator 125 attached thereto. Exhaust 134 provides venting from the space enclosed by the drip tray 138 (removed in FIG. 6). For purposes of illustration, lower dispense arm 112 has been removed from lower dispense arm support post 116.

Referring to FIGS. 1–6, one embodiment of the implementation of the substrate drying system 100 provides an inventive method for cleaning and drying a substrate 128. The desired chuck 122 is selected and configured according to the size of the substrate 128 that is to be cleaned and dried. Typically, batches of a single size of substrate 128 are processed for efficient implementation, but the ease of configuration provides for the processing of a plurality of substrate sizes.

Sliding spray shield door 152 is positioned in an open position by a pneumatic actuator moving a magnetic ball or bearing in pneumatic tube 150 as described above. Magnetic latch on sliding spray shield door 152 magnetically couples sliding spray shield door 152 to the magnetic ball, and as the magnetic ball travels through the pneumatic tube 150, the sliding spray shield door 152 slides into an open position. As the sliding spray shield door 152 is positioned into an open position, a "not closed" state is sensed by door sensor 158.

A robot (not shown) inserts a substrate 128 on to chuck 122. Substrate 128 is received in fingers 126, and moveable finger 127 is positioned by actuator 125 to attach and lock the substrate 128 into position on chuck 122, the substrate 128 being held at the edges at fingers 126 and moveable finger 127. The robot is withdrawn, and sliding spray shield door 152 slides into a closed position. The closed state is sensed by door sensor 158.

Wafer sensor 130b, attached to wafer sensor arm 130a senses the presence and orientation of a substrate 128. If a substrate 128 is present and correctly oriented (e.g., level), hollow spindle 123 with attached chuck 122 is permitted to spin. The hollow spindle 123 can be configured to rotate at 300 RPM or less, and up to 3000 RPM, depending on desired application. Hollow spindle 123 rotation is generated by spindle motor 120 which rotates the hollow spindle 123 using drive belt 132. In one embodiment, the spindle motor 120 is configured to provide tension adjustment of the drive belt 132. By way of example, the position of the spindle motor 132 can be adjusted toward or away from hollow spindle 123 to decrease or increase tension of the drive belt 132 respectively.

Hollow spindle 123 is configured to have a freely spinning, rotating part 123a configured to rotate and provide attachment for the chuck 122, and a fixed, stationary part 123b providing attachment to the substrate drying system 100. Additionally, attachment of the moveable finger actuator 125 is provided on the stationary part 123b of hollow spindle 123. The freely spinning or rotating part 123a can be configured similar to a shaft bearing with a hollow interior capable of freely spinning within a stationary housing. Drive belt 132 is configured to a lower region of the rotating part 123a of the hollow spindle 123. The chuck 122 containing fingers 126 and moveable finger 127 is attached to an upper region of the rotating part 123a of the hollow spindle 123 at attachment points 156, providing an easily configurable chuck 122 to accept a plurality of substrate sizes.

With a substrate 128 positioned in a substrate drying system 100 in accordance with an embodiment of the present invention, upper dispense arm 110 and lower dispense arm 112 are positioned at approximately a center of spinning substrate 128. Upper dispense arm 110 directs upper dispense nozzles 111a at a top or active surface of substrate 128, and lower dispense arm 112 directs lower dispense nozzles 111b at bottom or backside surface of substrate 128. Magnetically coupled upper dispense arm 110 and lower dispense arm 112 are positioned at substantially the same location on opposite sides of substrate 128.

In one embodiment, a cleaning agent is dispensed through cleaning agent supply 109b and 113b to the active surface and to the backside surface of the rotating substrate 128. A drying agent is dispensed through drying agent supply 109a and 113b to the active surface and to the backside surface of the rotating substrate 128. In one embodiment, the upper dispense arm head 140a directs the upper dispense nozzles 111a so that the cleaning agent precedes the drying agent as the upper dispense arm 110 travels over the active surface of substrate 128 from a center region to a periphery of the rotating substrate 128. Similarly, the lower dispense arm head 140b directs the lower dispense nozzles 111b so that the cleaning agent precedes the drying agent as the lower dispense arm 112 travels across the backside surface of substrate 128 from a center region to a periphery of the rotating substrate. In one embodiment, upper dispense nozzles 111a and lower dispense nozzles 111b are oriented to be angled away from the center and toward the edge of the substrate, in the general direction of nozzle travel during substrate processing. Cleaning agents are selected from a plurality of chemicals or DIW according to the desired application. The present invention includes embodiments for cleaning, etching, and rinsing of substrates. Examples of cleaning agents include DIW, solutions of HF, $NH_4OH$, $H_2O_2$, or any of acids such as HCl, $HNO_3$, $H_2CO_3$, HBr, $H_3PO_4$, $H_2SO_4$, and the like. Examples of drying agents include IPA, diacetone, ethyllactate, ethylglycol, methylpyrrolidon, and the like. As described above, when the drying agent is dispensed following the cleaning agent, the surface tension of the cleaning agent is reduced which facilitates the removal of the liquid by moving it outward towards the edge of the spinning substrate.

Figure 7:
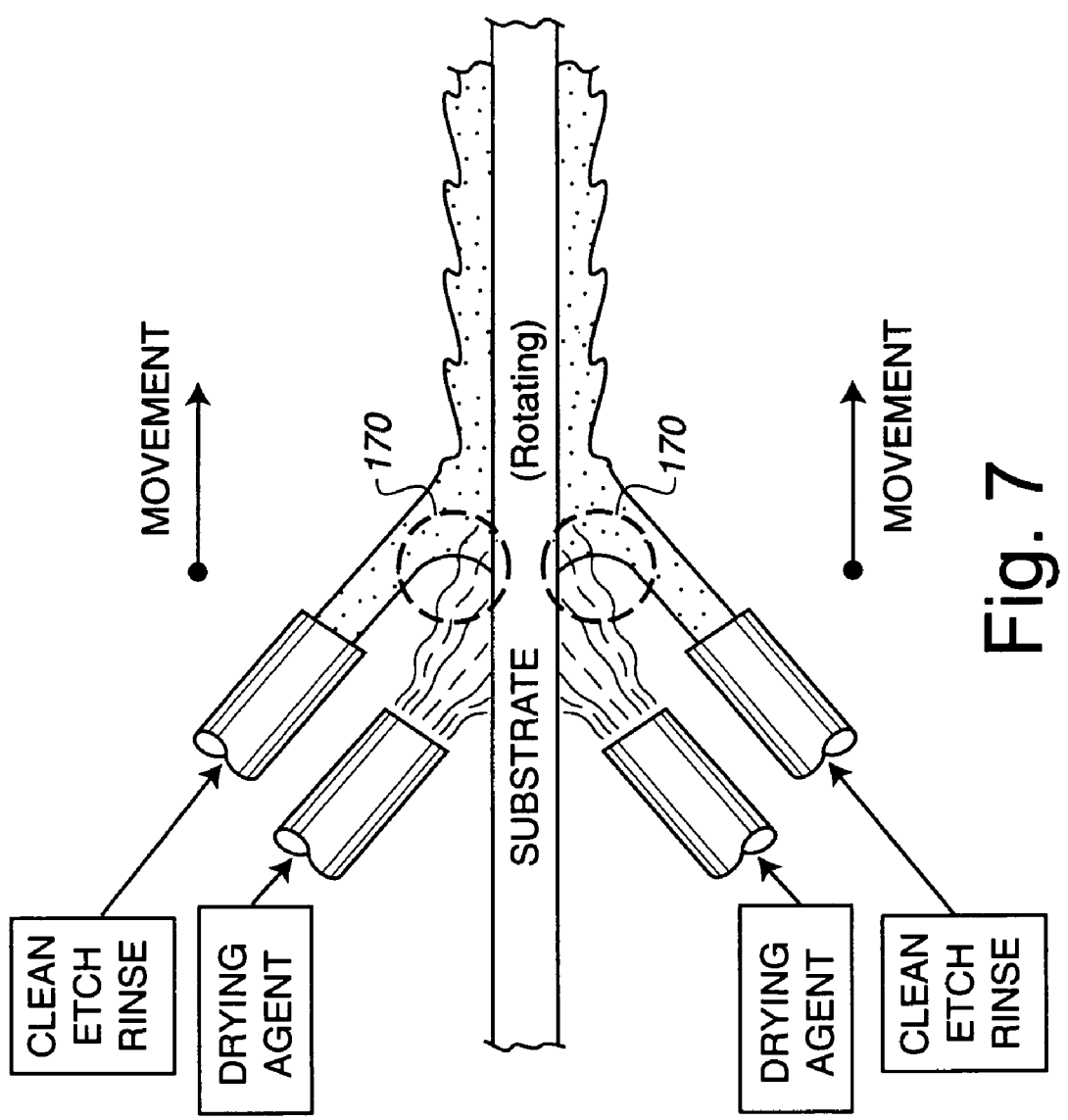
FIG. 7 illustrates the cleaning and drying process in accordance with one embodiment of the invention.

FIG. 7 illustrates the cleaning and drying process in accordance with one embodiment of the invention. A cleaning agent is applied ahead of a drying agent to a top surface and to a backside surface of a spinning substrate while moving from a center region of a substrate towards a periphery region of a substrate. The cleaning agent is configured to clean, etch or rinse the surfaces of the substrate, and at the introduction of the drying agent in region 170, the surface tension of the liquid is reduced and the movement of the liquid and residue is enhanced thereby drying the surfaces of the substrate.

The upper dispense arm 110 is magnetically coupled to the lower dispense arm 112 through the upper dispense arm support post 114 and the lower dispense arm support post 116, and the upper dispense arm is mechanically connected to the dispense arm drive shaft contained within the dispense arm drive shaft housing 118. In one embodiment, the movement of upper dispense arm 110 across the top surface of the spinning substrate 128 from a center region to a periphery is directed by a dispense arm controller contained within the dispense arm drive shaft housing 118. The dispense arm controller directs the dispense arm drive shaft which positions the upper dispense arm 110. The magnetically coupled lower dispense arm 112 mirrors the movement of the upper dispense arm 110, traveling from a center region to a periphery of spinning substrate 128 across the backside. This provides for simultaneous top and backside cleaning and drying.

Figure 8:
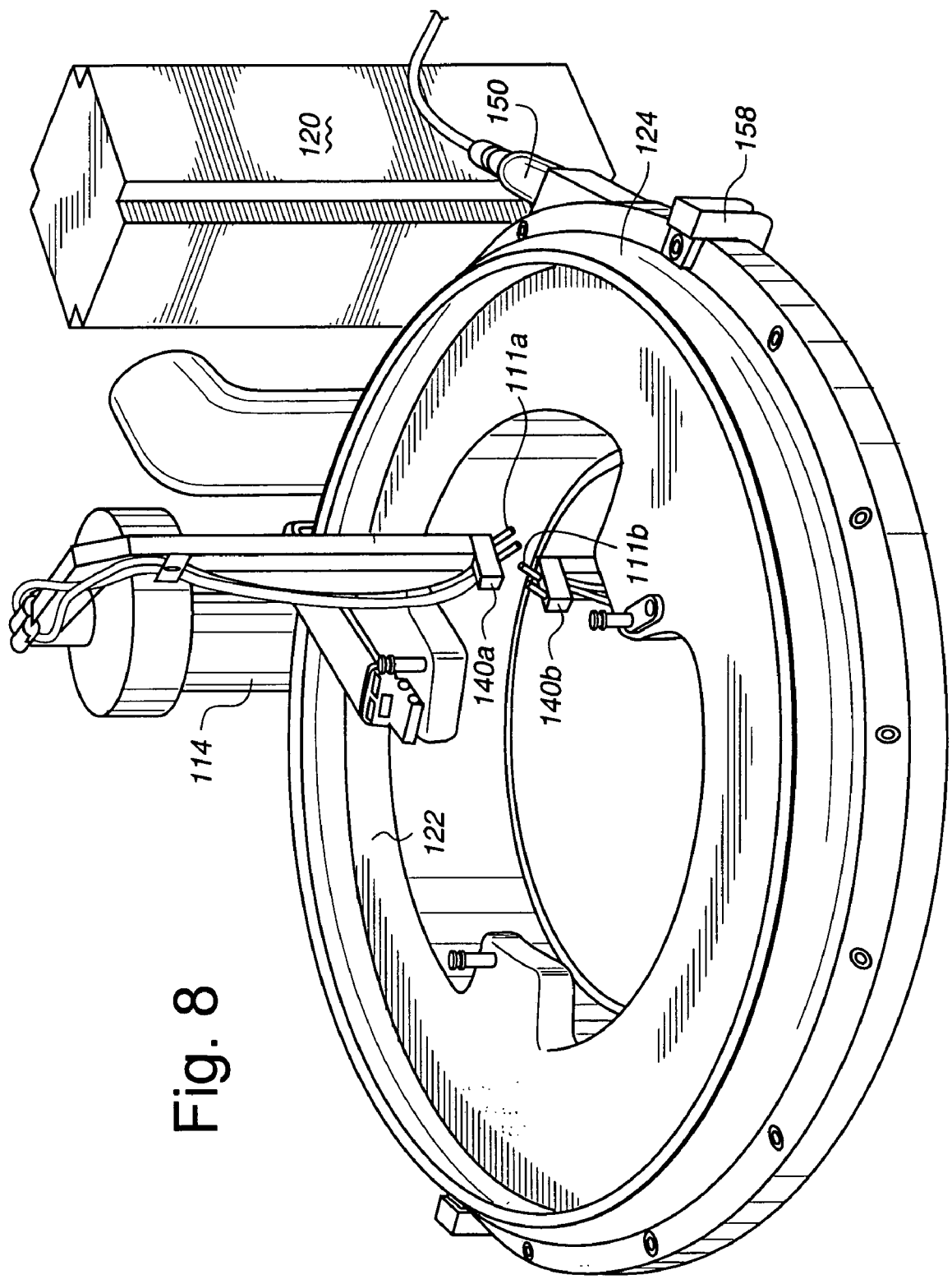
FIG. 8 shows lower dispense arm halted at a pre-determined point, and upper dispense arm allowed to continue travel in accordance with one embodiment of the invention.

In one embodiment of the invention, a brake or governor is configured to the lower dispense arm 112 to prevent contact between the lower dispense nozzles 111b and an interior surface of the hollow spindle 123. Substrate processing proceeds as described from a center of a rotating substrate towards a periphery of the rotating substrate. Upper dispense arm 110 and lower dispense arm 112 synchronously travel across the active and backside surfaces of the rotating substrate until a pre-determined point at or near the substrate edge. At the pre-determined point, the lower dispense arm 112 is stopped while the upper dispense arm 110 continues travel, moving the upper dispense nozzles 111a up to or across the substrate edge as desired. FIG. 8 shows lower dispense arm 112 halted at a pre-determined point, and upper dispense arm 110 allowed to continue travel in accordance with one embodiment of the invention. In one embodiment, another brake or governor is configured for upper dispense arm 110 defining the limit of travel of the upper dispense arm 110 within spindle 123 and chuck 122 cavity. When the upper dispense arm 110 and the lower dispense arm 112 are aligned as the upper dispense arm 110 is returned to the center region of the processing area, magnetic coupling is restored and the upper dispense arm 110 and the lower dispense arm 112 once again travel or are moved together.

Excess liquid from the cleaning agent and the drying agent is blocked from dispersal over the substrate drying system 100 by spray shield 124, and is substantially contained within the hollow cavity of the spindle 123 and chuck 122. As described above in reference to FIGS. 1 and 2, liquid residue is collected in drip tray 138, and drained through drain 136. In some embodiments, vaporized gases are used as drying agents and in the event of accumulated fumes or gases, exhaust 134 is provided to release such fumes or gases from within the confines of the drip tray 138.

FIG. 9 shows a substrate processing station 200 in accordance with one embodiment of the invention. In one embodiment, at least one substrate drying system 100 is integrated with at least one brush box scrubber 202 to create a substrate processing station for efficient processing that minimizes substrate transfer and exposure, as well as minimizing clean room floor space requirements. In this embodiment, at least one substrate drying system 100 is configured with at least one brush box 202 such that a substrate is first processed through one or more operations in the at least one brush box 202, and then transferred to the at least one substrate drying system 100 for a rinsing, drying, or other process. By way of example, a substrate drying system 100 may be mounted on top of a brush box 202 to minimize transfer distance and to minimize system or tool foot print. Further, in a clean room environment the filtration system can maintain an increasing level of cleanliness with elevation. Thus, the dirtier process of scrubbing is performed at a lower level, and the increasingly cleaner operation of substrate rinsing and drying is performed at a higher level.

In another embodiment, the substrate processing station 200 is integrated into a cluster of substrate processing tools, also known as a cluster tool or an integrated substrate processing cluster module, to maximize efficient use of clean room floor space, and to exploit economical and efficient implementation of substrate processing methods and systems. In just one example, one embodiment of the present invention is integrated into an integrated substrate processing cluster module including, by way of example, a wafer handling system, a load and unload module, an etch process module with a coupled etch load lock, and a chemical mechanical planarization (CMP) process module. An embodiment of the present invention is integrated into the cluster module as a clean process module capable of handling post-CMP clean and post-etch clean operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A system for rinsing and drying a substrate, comprising:
    (a) a chuck having fingers for edge gripping the substrate, the chuck being configured to rotate the substrate;
    (b) an upper dispense arm positioned over an active surface of the substrate, the upper dispense arm being capable of moving between a center region and a periphery of the active surface of the substrate, the upper dispense arm further having a pair of supply lines for delivering fluids over the active surface of the substrate;
    (c) a lower dispense arm positioned below a backside surface of the substrate and being magnetically coupled to the upper dispense arm with a governor to limit a range of movement of the lower dispense arm, the lower dispense arm being capable of moving between a center region and a periphery of the backside surface of the substrate, and having a pair of supply lines for delivering fluids over the backside surface of the substrate; and
    (d) a spray shield surrounding the substrate in the chuck, the spray shield having a section of the spray shield slideably configured to provide access to the chuck and to form a substantially solid spray shield surrounding the chuck,
    wherein when the upper dispense arm and the lower dispense arm move between the center region and the periphery of the substrate, a magnetic coupling provides that the upper dispense arm and the lower dispense arm remain aligned on opposite surfaces of the substrate, and the governor limits the movement of the lower dispense arm prior to a cessation of movement by the upper dispense arm.

2. The system for rinsing and drying a substrate of claim 1, wherein the chuck is an exchangeable chuck configured to be exchangeable with a chuck of a particular size for each of a plurality of substrate sizes.

3. The system for rinsing and drying a substrate of claim 2, wherein the chuck is a hollow chuck providing access to both the active surface and the backside surface at the same time.

4. The system for rinsing and drying a substrate of claim 3, further comprising a hollow spindle,
    wherein the hollow chuck is attached to the hollow spindle, the hollow spindle being configured to rotate and further configured to rotate the hollow chuck while providing access to both the active surface and the backside surface at the same time.

5. The system for rinsing and drying a substrate of claim 1, wherein each of the pair of supply lines of the upper dispense arm and each of the pair of supply lines of the lower dispense arm is configured to supply one of an etching fluid, a cleaning fluid, a rinsing fluid, and a drying agent.

6. The system for rinsing and drying a substrate of claim 5, wherein the cleaning fluid includes one of HF, $NH_4OH$, $H_2O_2$, HCl, $HNO_3$, $H_2CO_3$, HBr, $H_3PO_4$, and $H_2SO_4$.

7. The system for rinsing and drying a substrate of claim 5, wherein the drying agent includes one of isopropyl alcohol, diacetone, ethyllactate, ethylglycol, and methylpyrolidon.

8. The system for rinsing and drying a substrate of claim 1, further comprising a substrate sensor configured to determine accurate positioning of a substrate in fingers of the chuck.

9. The system for rinsing and drying a substrate of claim 1, further comprising a hollow spindle,
    wherein the chuck is attached to the hollow spindle.

10. A system for rinsing and drying a substrate, comprising:
    (a) a hollow chuck having fingers for edge gripping the substrate, the hollow chuck being attached to a hollow spindle and configured to rotate the substrate;

(b) a first dispense arm positioned adjacent to an active surface of the substrate, the first dispense arm being capable of moving between a center region and a peripheral edge of the active surface of the substrate, the first dispense arm further having a pair of supply lines for delivering fluids over the active surface of the substrate;

(c) a second dispense arm positioned adjacent to a backside surface of the substrate, the second dispense arm being magnetically coupled to the first dispense arm with a governor to limit a range of movement of the second dispense arm and capable of moving between a center region and a peripheral edge of the backside surface of the substrate, the second dispense arm further having a pair of supply lines for delivering fluids over the backside surface of the substrate and;

(d) a spray shield surrounding the substrate in the hollow chuck, the spray shield having a section of the spray shield slidably configured to provide access to the hollow chuck and to form a substantially solid spray shield encircling the hollow chuck, wherein when the first dispense arm and the second dispense arm move between the center region and the periphery of the substrate, a magnetic coupling provides that the first dispense arm and the second dispense arm remain aligned on opposite surfaces of the substrate, and the governor limits the movement of the second dispense arm prior to a cessation of movement by the first dispense arm.

11. The system for rinsing and drying a substrate of claim 10, further comprising:

a pneumatic tube along a base of the spray shield and the section of the spray shield;

a magnetic ball disposed within the pneumatic tube; and a magnetic latch configured to the section of the spray shield, wherein the magnetic latch is configured to slideably attach the section of spray shield to the pneumatic tube so that movement of the magnetic ball within the pneumatic tube slides the section of spray shield to configure the section of spray shield to one of providing access to the hollow chuck and forming the substantially solid spray shield encircling the hollow chuck.

12. The system for rinsing and drying a substrate of claim 10, wherein the hollow chuck is an exchangeable hollow chuck configured to be exchangeable with a hollow chuck of a particular size for each of a plurality of substrate sizes.

13. The system for rinsing and drying a substrate of claim 10, wherein the hollow chuck rotates on the hollow spindle and provides simultaneous access to both the active surface and the backside surface of the substrate.

14. The system for rinsing and drying a substrate of claim 10, wherein each of the pair of supply lines of the first dispense arm and each of the pair of supply lines of the second dispense arm is configured to supply one of an etching fluid, a cleaning fluid, a rinsing fluid, and a drying agent.

15. The system for rinsing and drying a substrate of claim 10, wherein the system is integrated with at least one brush box scrubber as an integrated substrate processing module.

16. The system for rinsing and drying a substrate of claim 10, wherein the system is integrated with a substrate processing cluster module including a wafer handling system, a load and unload module, and an etch process module.

17. The system for rinsing and drying a substrate of claim 10, wherein the system is integrated with a substrate processing cluster module including a wafer handling system, a load and unload module, and chemical mechanical planarization process module.

18. The system for rinsing and drying a substrate of claim 10, wherein the system is integrated with a substrate processing cluster module including a wafer handling system, a load and unload module, an etch process module, and chemical mechanical planarization process module.

19. The system for rinsing and drying a substrate of claim 10, wherein the hollow spindle is configured to rotate and is further configured to rotate the hollow chuck while providing simultaneous access to both the active surface of the substrate and the backside surface of the substrate.

* * * * *